United States Patent [19]

Matheson et al.

[11] Patent Number: 5,592,392

[45] Date of Patent: Jan. 7, 1997

[54] INTEGRATED CIRCUIT DESIGN APPARATUS WITH EXTENSIBLE CIRCUIT ELEMENTS

[75] Inventors: Thomas G. Matheson, Brookside; Joseph F. Cicchiello, Phillipsburg; Glenn Wikle, South Orange, all of N.J.

[73] Assignee: Mentor Graphics Corporation, Wilsonville, Oreg.

[21] Appl. No.: 343,756

[22] Filed: Nov. 22, 1994

[51] Int. Cl.$^6$ .................................... G06F 15/00
[52] U.S. Cl. .................. 364/490; 364/491; 364/489; 395/919; 395/921
[58] Field of Search .................... 364/488, 489, 364/490, 491, 578, 754, 746.1, DIG. 1, DIG. 2; 395/500, 400, 600, 650, 425, 700, 421.06, 919, 921–923, 135, 133, 141, 155, 161, 405, 452, 402; 257/208, 211; 326/39, 41, 101

[56] References Cited

U.S. PATENT DOCUMENTS

| | | | |
|---|---|---|---|
| 4,403,283 | 9/1983 | Myntti et al. | 395/402 |
| 4,809,170 | 2/1989 | Leblang et al. | 395/700 |
| 5,097,422 | 3/1992 | Corbin, II et al. | 364/491 |
| 5,111,413 | 5/1992 | Lazansky et al. | 364/578 |
| 5,187,788 | 2/1993 | Marmelstein | 395/600 |
| 5,301,318 | 4/1994 | Mittal | 364/578 |
| 5,371,865 | 12/1994 | Aikawa et al. | 395/452 |
| 5,377,340 | 12/1994 | Seroussi et al. | 395/405 |
| 5,378,904 | 1/1995 | Suzuki et al. | 364/488 |
| 5,379,391 | 1/1995 | Belsan et al. | 395/441 |
| 5,384,899 | 1/1995 | Amit | 364/578 |
| 5,394,546 | 2/1995 | Hanatsuka | 395/600 |
| 5,444,836 | 8/1995 | Hollingsworth et al. | 395/919 |

OTHER PUBLICATIONS

*CAECO Designer PDF Users Manual*, Mentor Graphics Corporation, Jul. 1992.
*IC Station Device Generator Manual—Software Version 8.5_1 (Preliminary)*, Jan. 1994.
*GDT Generator Creation and Compaction Manual*, Mentor Graphics Corporation, Dec. 1991.
*Physical Design Automation of VLSI Systems*, Ed. by B. T. Preas and Michael J. Lorenzetti, Benjamin/-Cummings, Menlo Park 1988; Ch. 6, pp. 211–267, 274–281. Jan. 1988.

Primary Examiner—Kevin J. Teska
Assistant Examiner—Jacques H. Louis-Jacques
Attorney, Agent, or Firm—Klarquist Sparkman Campbell Leigh & Whinston

[57] ABSTRACT

Method and apparatus for design integrated circuit layouts with extensible elements. The elements are generated by extensible element programs the first time the element is selected for a design, with the results stored in a run time cache. Element entries in the cache are accessible through a hash table, with each element reference hashed to provide a hash handle to the table. Subsequent hashes of an element reference provide access to the cache so that the same extensible element need not be regenerated by the element program each time the element is selected. To reduce the cache size, only the attributes of an element derived from the defining attributes of an element are cached. Other attributes such as location and orientation are stored with the element reference as part of a circuit design in a design database. In this way, related but different elements may use the same cache entry, with the differences then added once the cache entry is retrieved.

11 Claims, 6 Drawing Sheets

INTEGRATED CIRCUIT DESIGN APPARATUS WITH EXTENSIBLE CIRCUIT ELEMENTS

FIELD OF THE INVENTION

This invention relates generally to computer aided electronic design. More particularly, this invention relates to a means for allowing a user to add new circuit elements to a library of existing circuit elements used with an integrated circuit design apparatus. In using the apparatus, the user selects circuit elements from the library to construct integrated circuit layouts. Photolithographic masks for fabricating the integrated circuit are generated from the layout.

BACKGROUND OF THE INVENTION

Integrated circuits are designed today with computers using a computer program known as an integrated circuit design tool. With this tool, a circuit designer enters geometrical shapes representing elements of an integrated circuit design into a computer and manipulates the size and location of the shapes to produce a simulated layout of the circuit. The geometrical shapes correspond to circuit elements such as transistors or their parts, resistors and capacitors and appear on a computer display screen. These shapes represent a physical layer of material in an integrated circuit such as metal, insulation or polysilicon layers, with each material typically shown in a different color. From this simulated layout, the design tool generates data for producing photolithographic masks that are then used for fabricating the integrated circuit.

Some integrated circuit design apparatus include a library of basic circuit elements with which a circuit design may be constructed such as transistors, contacts, wires, etc. Rather than having to draw geometrical shapes of a circuit element from scratch, the user may obtain it from the library. Typically a user selects a circuit element from a library menu with a pointing device, and in response one or more geometrical shapes corresponding to the element appear in a workspace on screen. The user may then modify the size or shape of the corresponding geometrical shape as desired.

The libraries included with integrated circuit design apparatus are often quite limited. However, most design apparatus provide a means for users to create circuit elements and add them to the library. The means for creating elements is an user-added, or extensible, element "engine." Using a programming language understandable by the element engine, a user writes short computer programs called "generators" that define the behavior of an extensible element. These programs include device parameters (i.e., attributes) such as location, orientation, etc., so that variations of a basic extensible element may be created by varying the parameters while replicating the common part of the program. When the user selects an extensible element for inclusion in a circuit design, the engine interprets the element's program and provides the element to the layout.

Prior design apparatus with extensible element engines have had their drawbacks, primarily in the speed with which they provide the extensible elements and the appearance of the elements on screen. Each time an extensible element is added to a design, the program representing the element must be executed. Compared to built-in elements, providing extensible elements to a design takes much longer. If there are numerous extensible elements in a design, the delay is significant. And prior design apparatus have separated extensible elements from built-in elements in their human interface, requiring a user to learn two sets of commands to access both types of elements.

Accordingly, an object of the invention is to provide an integrated circuit design method and apparatus with extensible elements which behave as built-in circuit elements. Another object of the invention is to provide such method and apparatus in which the extensible elements are provided as quickly as built-in elements. Yet another object of the invention is to provide extensible elements that are indistinguishable from built-in elements by the user.

BACKGROUND OF THE INVENTION

The invention is a novel technique for rapidly accessing extensible elements in a layout without unduly increasing memory requirements. In connection with a reference to an extensible element in a layout, the defining attributes of the element are hashed to produce a corresponding identifier to the attributes. The element reference and identifier are stored for later access. If the identifier does not already exist for the layout (for example, if this is the first element of this type in use), then the defining attributes are applied to an extensible element generator and the derived attributes that result are stored in a cache such that they may be retrieved through the identifier. If the identifier already exists for the layout (for example, an identical element already exists in the layout), then the defined attributes are not applied to the generator. Subsequent element references to the same or identical elements require only to access the cache, perhaps through a hash table or its equivalent, via the identifier. Identical elements are distinguished from each other by instance attributes stored with the element reference and identifier.

The invention also improves user interface usability and consistency over prior art through the use of a common access scheme for both extensible and built-in elements. Because both are manipulated through their defining attributes they appear identical to the user in both the procedural and graphical interfaces, making the system easier to use and less error prone.

The foregoing and other objects, features, and advantages of the invention will become more apparent from the following detailed description of a preferred embodiment and the accompanying drawings.

DETAILED DESCRIPTION OF A PREFERRED EMBODIMENT

Figure 1:
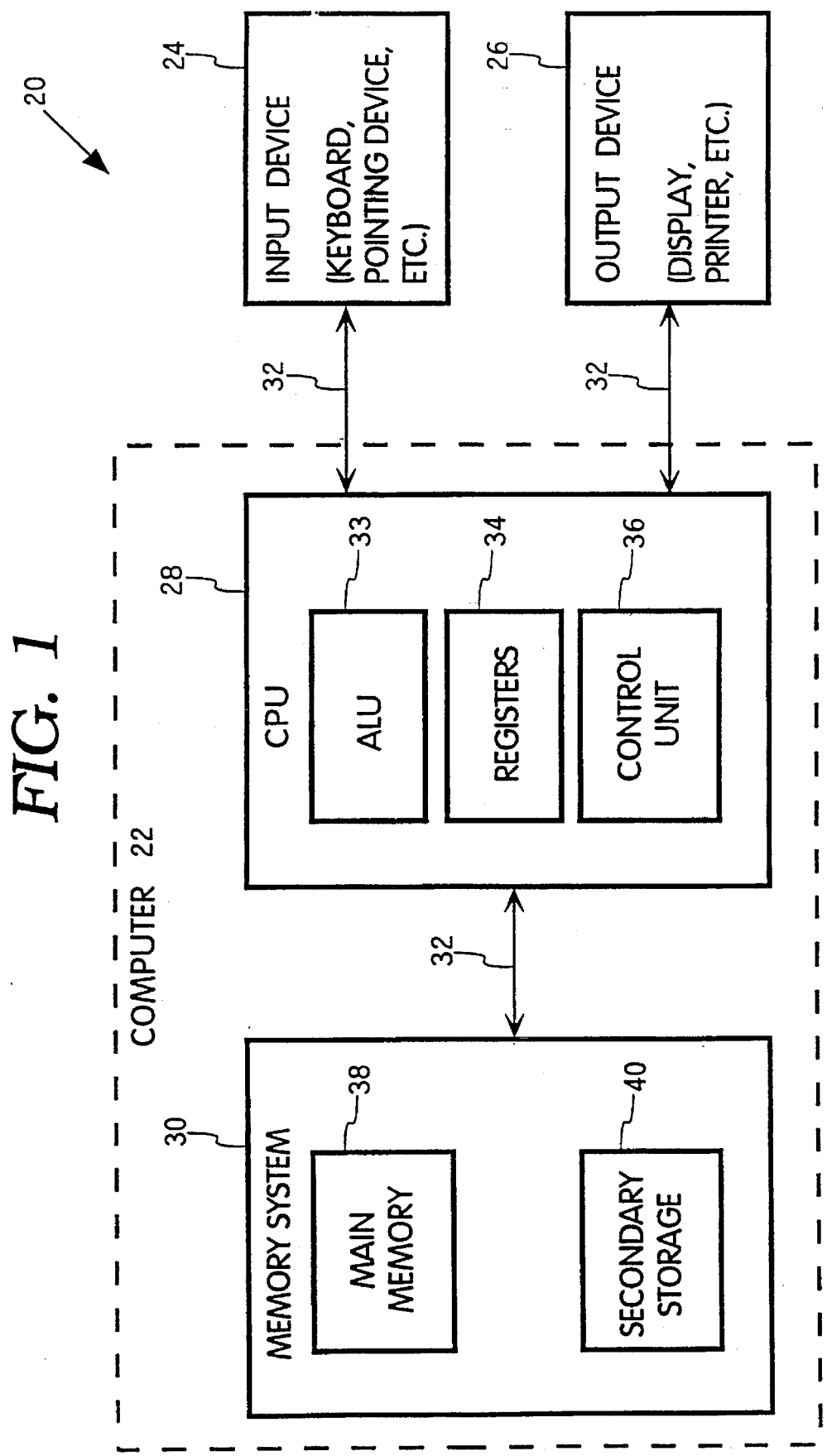
FIG. 1 is a block diagram of a computer system that may be used to implement a method and apparatus embodying the invention.

FIG. 1 is a block diagram of a computer system 20 which is used to implement an integrated circuit design method and apparatus embodying the invention. Computer system 20 includes as its basic elements a computer 22, input device 24 and output device 26.

Computer 22 generally includes a central processing unit (CPU) 28 and a memory system 30 that communicate through a bus structure 32. CPU 28 includes an arithmetic logic unit (ALU) 33 for performing computations, registers 34 for temporary storage of data and instructions and a control unit 36 for controlling the operation of computer system 20 in response to instructions from a computer program such as an application or an operating system.

Memory system 30 generally includes high-speed main memory 38 in the form of a medium such as random access memory (RAM) and read only memory (ROM) semiconductor devices and secondary storage 40 in the form of a medium such as floppy disks, hard disks, tape, CD-ROM, etc. and other devices that use optical or magnetic recording material. Main memory 38 stores programs such as a computer's operating system and currently running application programs. Main memory 38 also includes video display memory for displaying images through a display output device 26.

Input device 24 and output device 26 are typically peripheral devices connected by bus structure 32 to computer 22. Input device 24 may be a keyboard, modem, pointing device, pen, or other device for providing input data to the computer. Output device 26 may be a display device, printer, modem, sound device or other device for providing output data from the computer. The input and output devices may be physically combined into a single device if desired.

It should be understood that FIG. 1 is a block diagram illustrating the basic elements of a computer system 20; the figure is not intended to illustrate a specific architecture for a computer system 20. For example, no particular bus structure is shown because various bus structures known in the field of computer design may be used to interconnect the elements of the computer system in a number of ways, as desired. CPU 28 may be comprised of a discrete ALU 33, registers 34 and control unit 36 or may be a single device in which these parts of the CPU are integrated together, such as in a microprocessor. Moreover, the number and arrangement of the elements of the computer system may be varied from what is shown and described in ways known in the art (i.e., multiple CPUs, client-server systems, computer networking, etc.).

Figure 2:
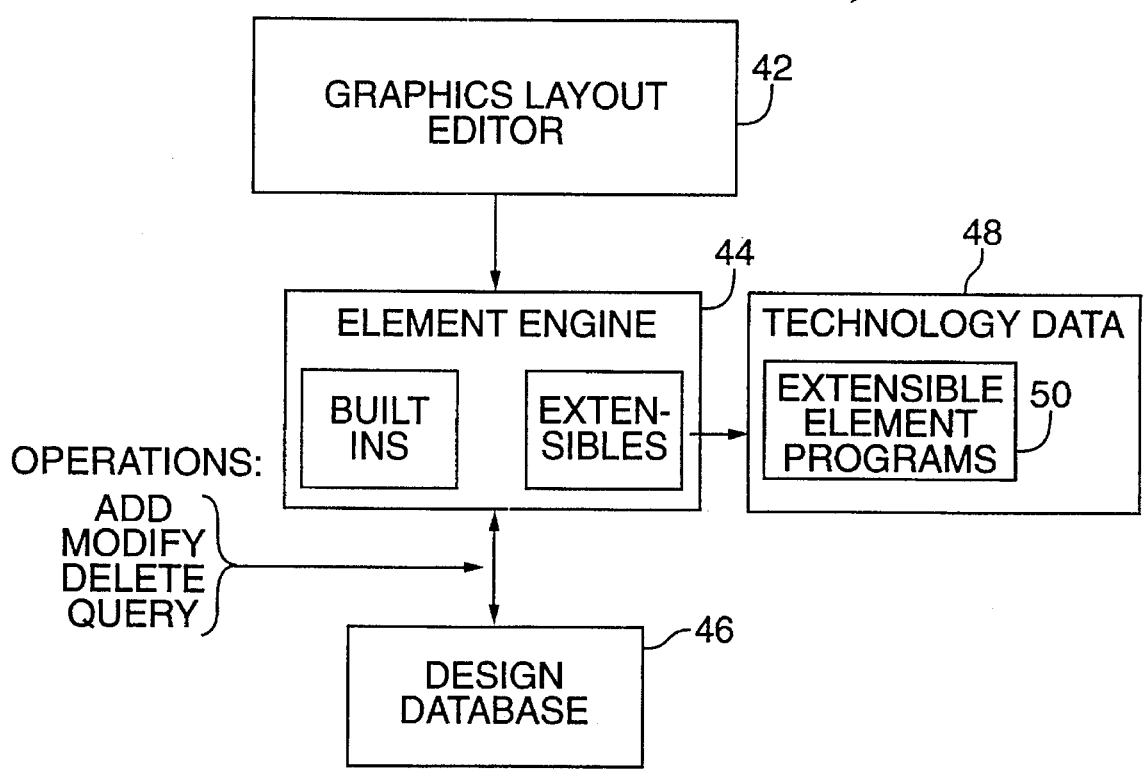
FIG. 2 is a block diagram of an integrated circuit design apparatus embodying the invention.

FIG. 2 is a block diagram of the relevant parts of an integrated circuit design apparatus 41 embodying the invention. In the present embodiment, the apparatus 41 is implemented with a computer program executing on computer system 20, and the parts of the apparatus are implemented in modules of code. It will be understood by those of skill in the art, of course, that apparatus 41 could also be implemented in other ways, such as in a equivalent hardware device.

Shown within FIG. 2 is a conventional interactive graphics IC layout editor 42 with which a user edits an IC layout. The editor 42, which is operable via a keyboard, mouse or other input device 24, allows a user to select circuit elements from a menu on the screen of a display device 26 and to add, move, modify and otherwise arrange the selected elements to create an integrated circuit. The graphics editor, of course, is but one of many ways to enter commands and circuit elements into apparatus 41. Other ways include text commands, user written programs known as layout generators, etc. well known in the art. For the purpose of this description, all of these techniques are represented by editor 42. These editor requests concerning circuit elements are communicated from the graphics editor to an element engine 44 that contains built-in elements and extensible circuit elements and is also a database manager. The engine 44 stores references to editor-elected elements in a design database 46. The element engine 44 may access the design database in conventional fashion with commands such as add, modify, delete, query, etc., to store and retrieve circuit elements as they are added or modified in a circuit layout.

Also in communication with the element engine 44 is a technology data module 48 that includes extensible element programs 50, or generators. These programs provide extensible elements to the engine 44 as required. In response to a call from engine 44, one of the extensible element programs generates the attributes of an extensible element, which are then stored by the element engine with a reference stored in the design database.

Figure 3:
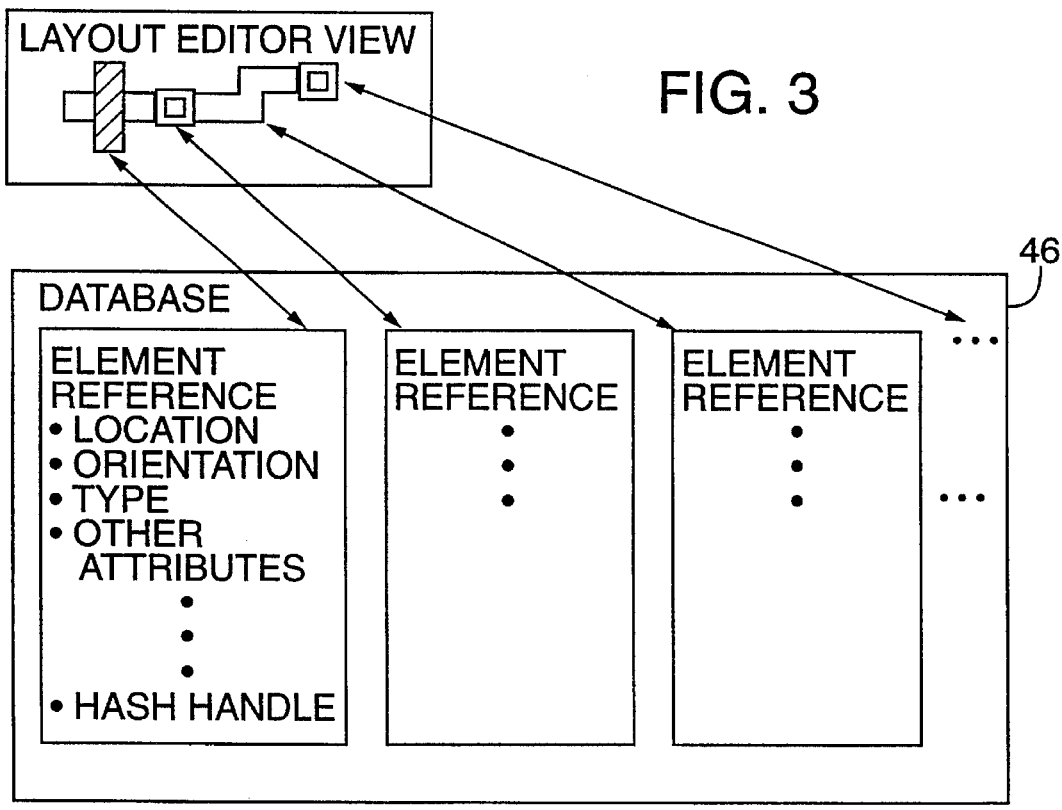
FIG. 3 is a visual representation of how circuit elements of a layout design appear in the design database of FIG. 2.

FIG. 3 illustrates how data is stored in design database 46 for a circuit layout. Each circuit element has a record with an element reference that also includes defining attributes of the element and other attributes such as the location and orientation of the element. With this data, the design apparatus 41 can display a layout on a display device 26 and allow a user to modify or add to the layout as desired.

Figure 4:
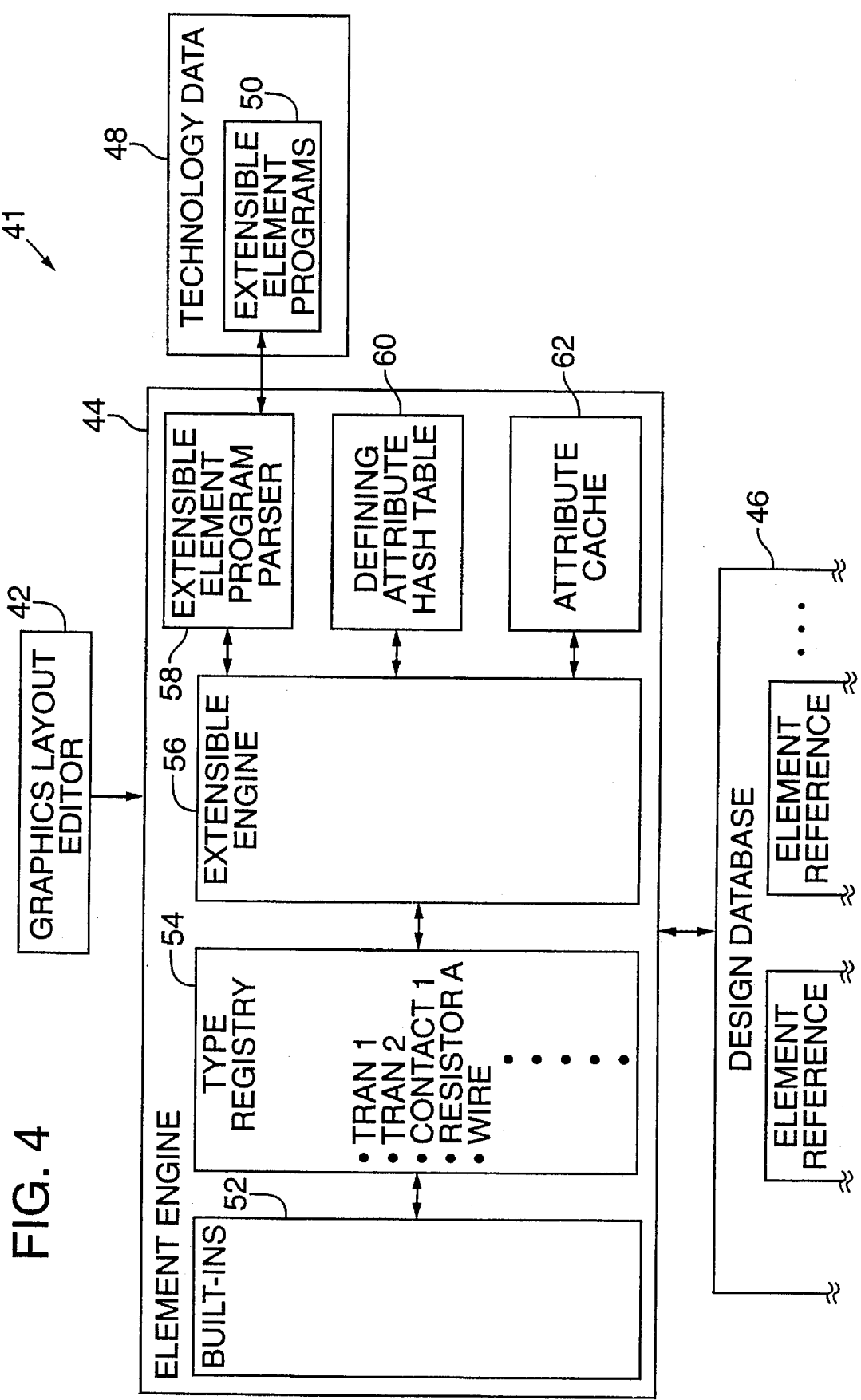
FIG. 4 is a more detailed diagram of the element engine shown in FIG. 2.

FIG. 4 is a more detailed diagram of the structure of element engine 44. The engine includes a collection 52 of built-in elements such as geometrical shapes, lines, etc., that come with the apparatus. These elements are registered in a type registry 54, which is communicated to the editor 42 upon start up of the apparatus. The type registry 54 also receives element information from extensible engine 56. The information describes the extensible elements, created via extensible element programs 50. However, the extensible nature of these elements is transparent to the user because they appear in the type registry 54 in the same format as the built-in elements.

The extensible engine 56 also communicates with an extensible element program parser 58, a defining attribute hash table 60 and an attribute cache 62. If the extensible element has not been previously generated, the parser 58 receives element references from the extensible engine 56, including the defining attributes of the element, such as its material, family, type, width and length, ports, etc. Using these attributes, it selects the appropriate extensible element program. The program then executes and returns to the extensible engine derived attributes which are cached in the attribute cache 62. From the cache these attributes can be retrieved quickly whenever a reference is made to the extensible element. Unlike the prior art, the extensible element program for this element need only be executed once for the element because its results are cached for reuse.

The following table describes the nature of the defining attributes passed by the engine 56 to the programs 50 (i.e., type and path) and the nature of the attributes derived from the defining attributes:

TABLE I

ExtTransistor( type,path )
{
    1.  Calculate and register the geometry:
        Poly path
        Diffusion path
        Various element ports
        etc.
    2.  Calculate and register all other Attributes:
        Family                      Transistor
        Type                        TN
        Path                        (Centerline & width)
        Effective Width       24
        Effective Length      2
        etc.
}

In the process of passing the defining attributes to the program 50, the extensible element engine also hashes the defining attributes into a hash handle. This hash handle is stored in hash table 60 and is used to access the cache 62 for retrieving the associated derived attributes. The hash handle is preferably appended to the element reference that is stored in the design database so that it may be looked up directly in hash table the next time the element is referenced.

Figure 5A:
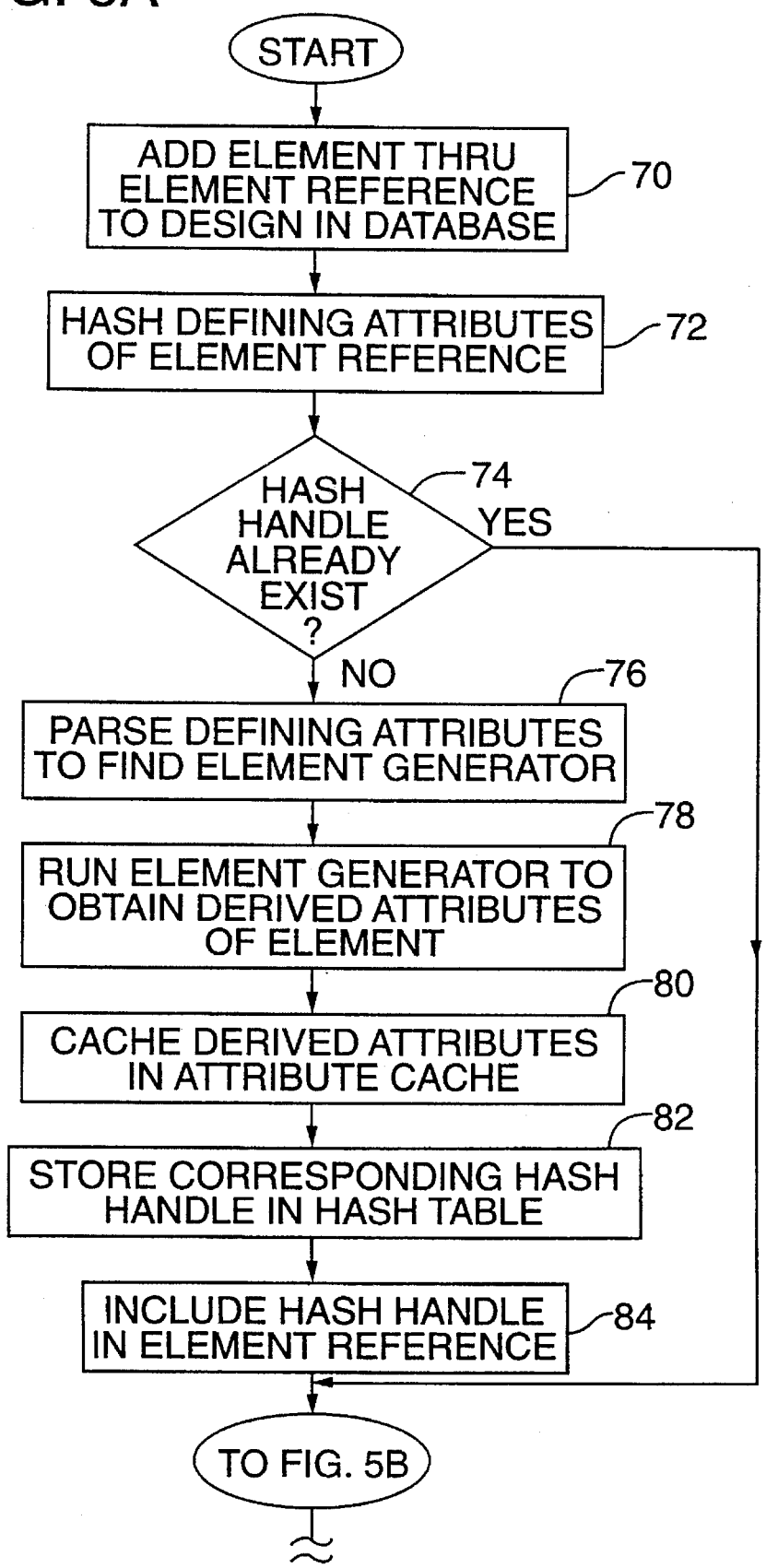
FIGS. 5A, B are flowcharts illustrating a method embodying the invention for providing extensible elements.
Figure 5B:
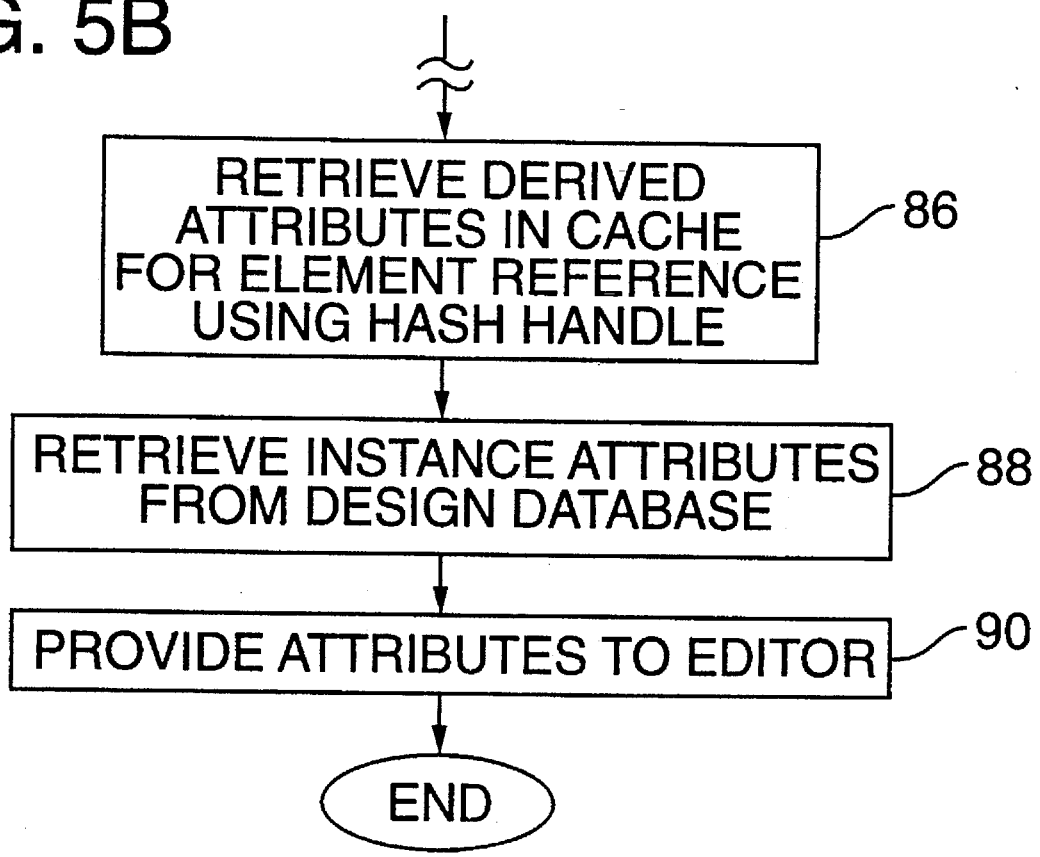
Figure 6:
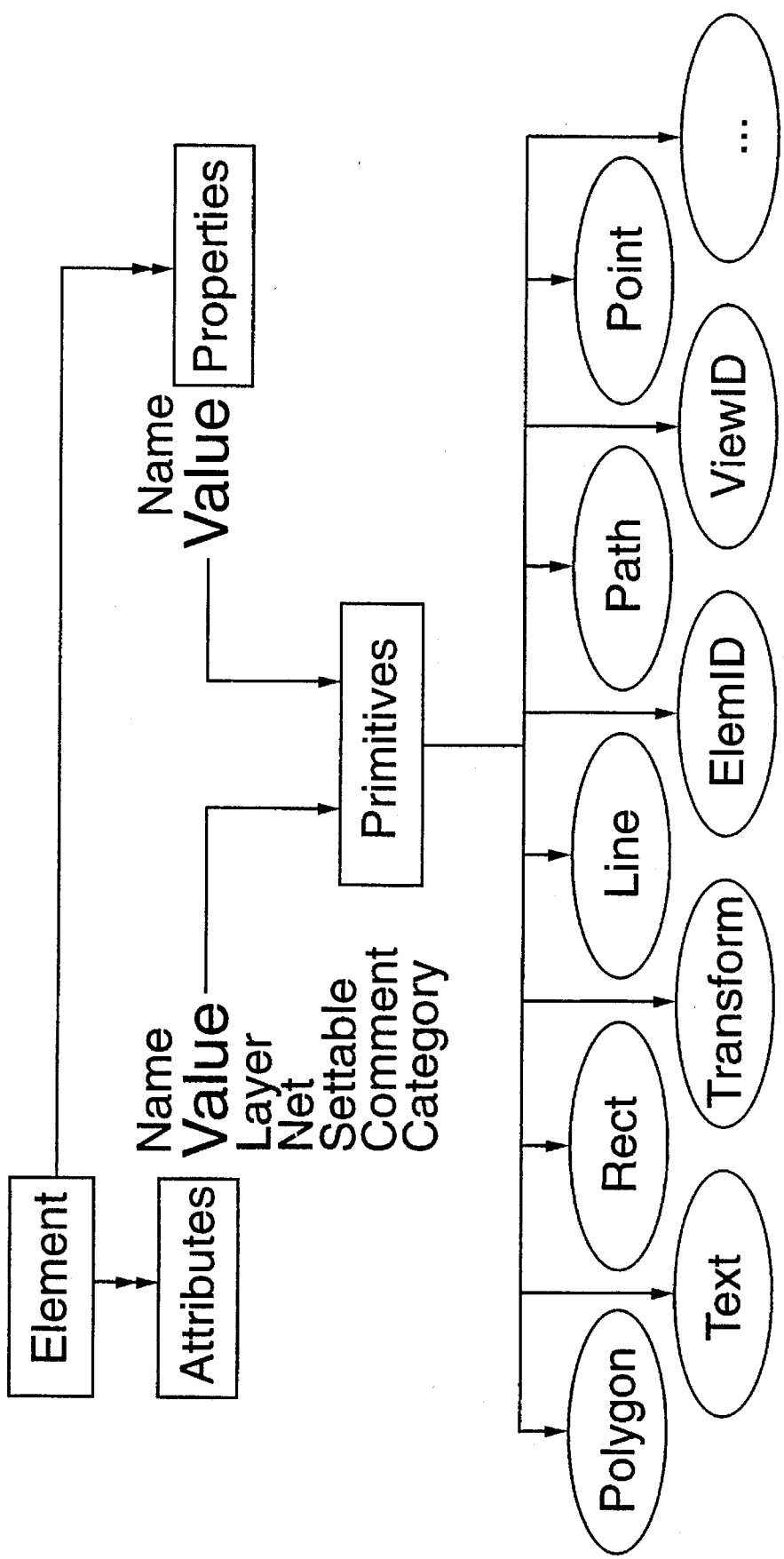
FIG. 6 shows various aspects of the preferred embodiment.

The advantage of the present invention over prior art apparatus is best illustrated by example, with reference to FIGS. 4 and 5A, B. Upon startup of the apparatus, editor 42 is informed by the element engine 44 of the elements available to it in type registry 54. These include the built-in elements 52 and the extensible elements available in the technology data module 48. Elements have several types of attributes including instance attributes such as location, orientation and reflection coordinates; and defining attributes such as described previously.

Referring now to FIG. 5A, the user begins by selecting an element from the type registry 54 for a design, using an element reference provided by the element engine 44 (70). The element reference initially may be a symbol or text describing the element to the editor. Although the user may not be able distinguish between built-in elements and extensible elements in the apparatus 41, the element engine does. Assuming the element selected is recognized as extensible, the extensible engine hashes on the defining attributes to produce the hash handle using any of a number of well know hashing techniques (72). The extensible element engine 56 then checks to determine if the hash handle already exists in the hash table 60 (74). Since this is the first time the extensible element has been referenced, there is no entry for it in the hash table.

The extensible element engine 56 the passes the defining attributes to the parser 58 (76), which parses the attributes to find the corresponding element program 50. The element program the generates derived attributes (78) which it returns to the extensible engine 56. The engine 56 stores these derived attributes in the attribute cache 62 (80) along with a corresponding hash handle in hash table 60 (82). The engine 56 also includes the hash handle in the element reference (84).

If the element reference has been previously selected by the editor 42, then a hash handle would already exist (74) and steps 76–84 would have already been taken.

To display the selected element, the apparatus 41 retrieves the derived attributes from the cache 62, using the element reference with its hash handle (86). The apparatus also retrieves instance attributes from the element reference in the database (88). These retrieved attributes are provide to the editor, which uses them to display the extensible element.

Another significant difference between the present invention and the prior art is the way in which extensible elements are stored in the cache. Some of the attributes of an element such as the instance attributes are not stored in the cache, because this could lead to overfilling the cache. Instead, only core defining attributes are used for the element programs 50, and instance attributes are stored in the database. The elements in the cache are thus not identical, but each representation there represents a family of elements that differs in ways that can be recorded in the design database as part of the element reference.

The following Table shows various aspects of the preferred embodiment:

TABLE 2

Extensible Elements

The primary way to extend the Data Model in the Symbolic Engine
- ☐ Analogous to a parameterized cell, but optimized for performance.
- ☐ Features:
    - Parameterized generators written in interpreted extension language
    - Optimized storage:
        Based on parameter set
        Design-wide
        Location and orientation are stored in instance
    - Optimized (minimal) generator calling:
        Based on parameter set
        Design-wide
    - Optimized retrieval of calculated attributes and geometry
    - Graphically selectable and editable based on defining shape
    - Family and Type automatically appear in Element Menus
  Element Generator Conceptual Example:
      ExtTransistor(type, path)
          1. Calculate and register the geometry:
              Poly path
              Diffusion path
              Various element ports
              etc.
          2. Calculate and register all other Attributes:
              Family           Transistor
              Type             TN
              Path             (Centerline & width)
              Effective Width  24
              Effective Length 2
              etc.
- ☐ Uses:
    - MOS Transistors, resistors, capacitors, etc.
    - BIPOLAR transistors, resistors, capacitors, etc.
    - Schematic transistors, resistors, capacitors, etc.
    - Vias, contacts, etc.
    - Keep-out regions, area markers, etc.
    - Routing guides, channel markers, reticle markers, etc.
    - etc.
- ☐ Use Extensible elements to integrate data from three existing product lines: GDT, TABLE 2-continued ICStation, and Caeco.
Extensible elements are the primary way to extend the Data Model in the Symbolic
Engine. The Graphical Interface automatically extends with the element set.

Having illustrated and described the principles of the invention in a preferred embodiment, it should be apparent to those skilled in the art that the embodiment can be modified in arrangement and detail without departing from such principles. In view of the many possible embodiments to which the principles of our invention may be applied, it should be recognized that the illustrated embodiment is only a preferred example of the invention and should not be taken as a limitation on the scope of the invention. Rather, the invention is defined by the following claims. We therefore claim as our invention all that comes within the scope and spirit of these claims.

We claim:

1. A method of rapidly providing access to extensible elements in a layout, the method comprising the following steps:

in connection with an element reference, hashing defining attributes of an extensible element to produce a corresponding identifier;

storing each element reference to a selected element along with its identifier;

if the identifier of an extensible element does not yet exist for the layout, applying the defining attributes of the element to an extensible element generator and caching derived element attributes that result in an attribute cache, the derived attributes associated with the defining attributes' identifier;

if the identifier of an extensible element already exists for the layout, not applying the defining attributes to the extensible element generator; and providing access to the extensible element by using its defining attributes' identifier to retrieve the derived attributes from the attribute cache.

2. The method of claim 1 wherein the defining attributes' identifier is a handle derived by hashing the element's defining attributes.

3. The method of claim 1 including storing the identifier in a hash table for associating the identifier with derived attributes in the attribute cache, the hash table being checked to determine if the identifier already exists for the layout.

4. The method of claim 1 wherein the step of retrieving the derived attributes from the attribute cache comprises using the identifier to look up in a hash table the location of the derived attributes in the attribute cache.

5. The method of claim 1 wherein the storing step includes storing instance attributes of design location and orientation of the element, and the providing step includes combining instance attributes of the element with the derived attributes from the attribute cache.

6. The method of claim 1 wherein the attribute cache is a storage area in memory.

7. A computer-readable medium on which is stored a computer program comprising instructions which when executed by a computer perform the method of claim 1.

8. Apparatus for rapidly providing extensible elements to a layout, comprising:

an extensible element generator for generating derived attributes of an extensible element from defining attributes;

an attribute cache for caching derived attributes generated by the extensible element generator; and means for associating defining attributes of an extensible element with derived attributes in the attribute cache to retrieve derived attributes from the cache, whereby the defining attributes of extensible elements are the same for identical elements.

9. The apparatus of claim 8 wherein the means for associating comprises a hash table for associating an identifier corresponding to defining attributes of an element with the element's derived attributes in the attribute cache.

10. Apparatus for rapidly providing extensible elements to a layout, comprising:

a design database for storing references to elements in a design along with instance attributes of design location and orientation and an identifier corresponding to the element's defining attributes;

an extensible element generator for generating derived attributes of an extensible element from defining attributes;

an attribute cache for caching derived attributes of extensible elements generated by the element generator; and a hash mechanism for associating an identifier of an element's defined attributes with derived attributes stored in the cache;

whereby upon entry of an element reference into the design database, the element's defining attributes are hashed to produce the identifier and the identifier is applied to the hash mechanism to determine if the derived attributes for the element are available in the attribute cache, and, if not, applying the defined attributes to the element generator to generate the derived attributes for the cache.

11. The apparatus of claim 10 including means for combining the instance attributes with the derived attributes to represent an instance of the extensible element in the design.

* * * * *